United States Patent
Yatsuo et al.

(10) Patent No.: US 7,852,083 B2
(45) Date of Patent: Dec. 14, 2010

(54) MAGNETIC RESONANCE IMAGING APPARATUS AND GRADIENT MAGNETIC FIELD COIL

(75) Inventors: Takeshi Yatsuo, Tokyo (JP); Hiroyuki Takeuchi, Tokyo (JP); Akira Kurome, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 139 days.

(21) Appl. No.: 12/296,719

(22) PCT Filed: Apr. 10, 2007

(86) PCT No.: PCT/JP2007/057920
§ 371 (c)(1),
(2), (4) Date: Oct. 10, 2008

(87) PCT Pub. No.: WO2007/119726
PCT Pub. Date: Oct. 25, 2007

(65) Prior Publication Data
US 2009/0066332 A1    Mar. 12, 2009

(30) Foreign Application Priority Data
Apr. 14, 2006    (JP) ............................. 2006-112473

(51) Int. Cl.
*G01V 3/00*    (2006.01)
(52) U.S. Cl. ........................................ 324/318; 324/307
(58) Field of Classification Search .......... 324/300–322
See application file for complete search history.

(56) References Cited

U.S. PATENT DOCUMENTS

| | | | | |
|---|---|---|---|---|
| 5,475,355 A | * | 12/1995 | Abele et al. | 335/301 |
| 5,512,828 A | * | 4/1996 | Pausch et al. | 324/309 |
| 5,600,245 A | * | 2/1997 | Yamamoto et al. | 324/318 |
| 5,939,882 A | * | 8/1999 | Gebhardt et al. | 324/318 |
| 6,556,011 B1 | * | 4/2003 | Yui | 324/318 |
| 6,618,606 B2 | * | 9/2003 | Overweg et al. | 600/410 |
| 6,630,828 B1 | * | 10/2003 | Mistretta et al. | 324/309 |
| 6,911,821 B2 | * | 6/2005 | Goldie | 324/318 |
| 6,933,723 B2 | * | 8/2005 | Schulz et al. | 324/318 |
| 7,343,670 B2 | * | 3/2008 | Schuster et al. | 29/606 |
| 7,417,432 B2 | * | 8/2008 | Overweg | 324/318 |

FOREIGN PATENT DOCUMENTS

| | | |
|---|---|---|
| JP | 2004-130141 | 4/2004 |
| JP | 2004-267405 | 9/2004 |
| JP | 2005-168042 | 6/2005 |

* cited by examiner

*Primary Examiner*—Brij B. Shrivastav
*Assistant Examiner*—Dixomara Vargas
(74) *Attorney, Agent, or Firm*—Cooper & Dunham LLP

(57) ABSTRACT

An MRI apparatus excellent in magnetic field generation efficiency is provided. According to this invention, a main coil (52) of a gradient magnetic field coil (13) is partially recessed to reduce the total thickness of a radio-frequency coil (11) and a gradient magnetic field coil (13). That is, the main coil (52) is designed in a tubular shape, and the diameter r1 at the center portion of the imaging space is larger than the diameter r2 of the main coil end portion. Accordingly, the RF coil (11) can be disposed to be near to the gradient magnetic field coil (13) side without lowering the magnetic field generation efficiency.

22 Claims, 13 Drawing Sheets

215 MAIN COIL

MAGNETIC RESONANCE IMAGING APPARATUS AND GRADIENT MAGNETIC FIELD COIL

TECHNICAL FIELD

The present invention relates to a magnetic resonance imaging (hereinafter referred to as MRI) apparatus, and particularly to a gradient magnetic field coil with which an imaging space in which an examinee is disposed can be secured as a large space and which can be easily manufactured, and an MRI apparatus having the gradient magnetic field coil.

BACKGROUND ART

An MRI apparatus measures a signal obtained from a nuclear magnetic resonance (hereinafter referred to as "NMR") phenomenon of an examinee disposed under a static magnetic field, and subjects the signal to calculation processing to display images of a density distribution, a relaxation time distribution, etc. of nuclear spins in the examinee as tomograms, and it is used for various kinds of diagnosis, etc. while targeting human bodies as examinees.

In the MRI apparatus, an examinee is disposed in a static magnetic field space (imaging space) having spatially and timely uniform intensity and direction which is formed by a magnet, pulsed electromagnetic waves are applied to the examinee by an RF coil, and a generated NMR signal is received by the RF coil. At the reception time, in order to add position information to the NMR signal, a gradient magnetic field is generated in the imaging space by a triaxially-orthogonal gradient magnetic field coil.

An active shield type gradient magnetic field coil (Active Shield Gradient Coil: ASGC) can be adopted as the gradient magnetic field coil. ASGC has a main coil and a shield coil in each of three axial directions, so that the pulse magnetic field leaking to the magnet side can be reduced. Therefore, it is possible to reduce unnecessary magnetic field which is transiently varied by eddy current adversely affecting MRI imaging.

In the MRI apparatus as described above, the total thickness of the elements from the RF coil till the gradient magnetic field coil, containing a cover, is typically equal to about 150 mm. In order to secure a broad imaging space in which an examinee is disposed, it is considered that the internal diameter of a magnet is increased by the amount corresponding to the total thickness from the thickness of the cover till the thickness of the gradient magnetic field coil. However, in this case, the static magnetic field generating efficiency is lowered and thus large magnetomotive force is needed. For example, in the case of a superconducting magnet, many superconducting wires are used. Therefore, the cost of a magnet is increased. Conversely, it is also considered that the internal diameter of the magnet is not varied and the thickness of the gradient magnetic field coil is reduced. However, in this case, the interval between the main coil and the shield coil is reduced, so that the generation efficiency of the gradient magnetic field is lowered and thus a lot of current is needed to generate a desired gradient magnetic field.

Therefore, for example, Patent Document 1 has proposed the structure that a recess portion is provided at the center portion of a gradient magnetic field coil and an RF coil is disposed at the recess portion. By this structure, a large imaging space can be secured, and the interval between the main coil and the shield coil can be increased at the end portion area of the gradient magnetic field coil. Therefore, a desired gradient magnetic field can be generated in the imaging space by small current, and thus the generation efficiency of the gradient magnetic field is excellent.

Patent Document 1: JP-T-2005-515051

However, the structure that the recess portion is provided at the center portion of the gradient magnetic field coil as in the case of the Patent Document 1 cannot be manufactured easily. For example, a gradient magnetic field coil is manufactured by separately manufacturing the center portion, end portion and step portion of the gradient magnetic field coil and positioning and connecting many wires formed in these parts to one another. Such a manufacturing process is complicated, and the manufacturing cost is increased.

BRIEF SUMMARY

In an aspect of this disclosure, there are provided a gradient magnetic field coil with which an examinee-disposed imaging space can be broadly secured and which can be easily manufactured, and an MRI apparatus having the gradient magnetic field coil as described above.

In another aspect of this disclosure, there is provided a magnetic resonance imaging apparatus that comprises a main coil for generating a gradient magnetic field in an imaging space, and a shield coil that is disposed between the main coil and a static magnetic field generator and generates a magnetic field which offsets a leak magnetic field from the main coil to the static magnetic field generator side, wherein the distance in the vertical direction between the main coil and the horizontal axis passing through the center point of the imaging space is reduced with the shift from the center portion of the main coil to the end portion of the main coil.

Further, in a gradient magnetic field coil which is used in a magnetic resonance imaging apparatus and comprises a main coil for generating a gradient magnetic field in an imaging space and a shield coil for generating a magnetic field offsetting a leak magnetic field from the main coil to the opposite side to the imaging space, the interval between the main coil and the shield coil is increased with the shift from the center portion of the main coil to the end portion thereof.

In another aspect, the magnetic resonance imaging apparatus is provided with the main coil for generating the gradient magnetic field in the imaging space and the shield coil which is disposed between the main coil and the static magnetic field generator and generates a magnetic field for offsetting a leak magnetic field from the main coil to the static magnetic field generator side, wherein the main coil has a center portion confronting the center point of the imaging space and a side portion disposed at the end portion side of the center portion so as to be separated from the center portion, at least a part of the end portion of the center portion and at least a part of the end portion at the center portion side of the side portion are overlapped with each other in the vertical direction, and the distance in the vertical direction between the main coil and the horizontal axis passing through the center point of the imaging space is stepwise reduced with the shift from the center portion to the side portion.

According to the aforementioned gradient magnetic field coil, a circuit pattern is formed on an electrically conductive plate having such a shape that an imaging space in which an examinee is disposed can be broadly secured, and then the electrically conductive plate is deformed or processed, whereby a gradient magnetic field coil can be manufactured. As a result, the gradient magnetic field coil with which the examinee is disposed can be broadly secured can be easily manufactured. The MRI apparatus having the gradient magnetic field coil of the invention can secure the broad imaging space in which the examinee is disposed.

Figure 1:
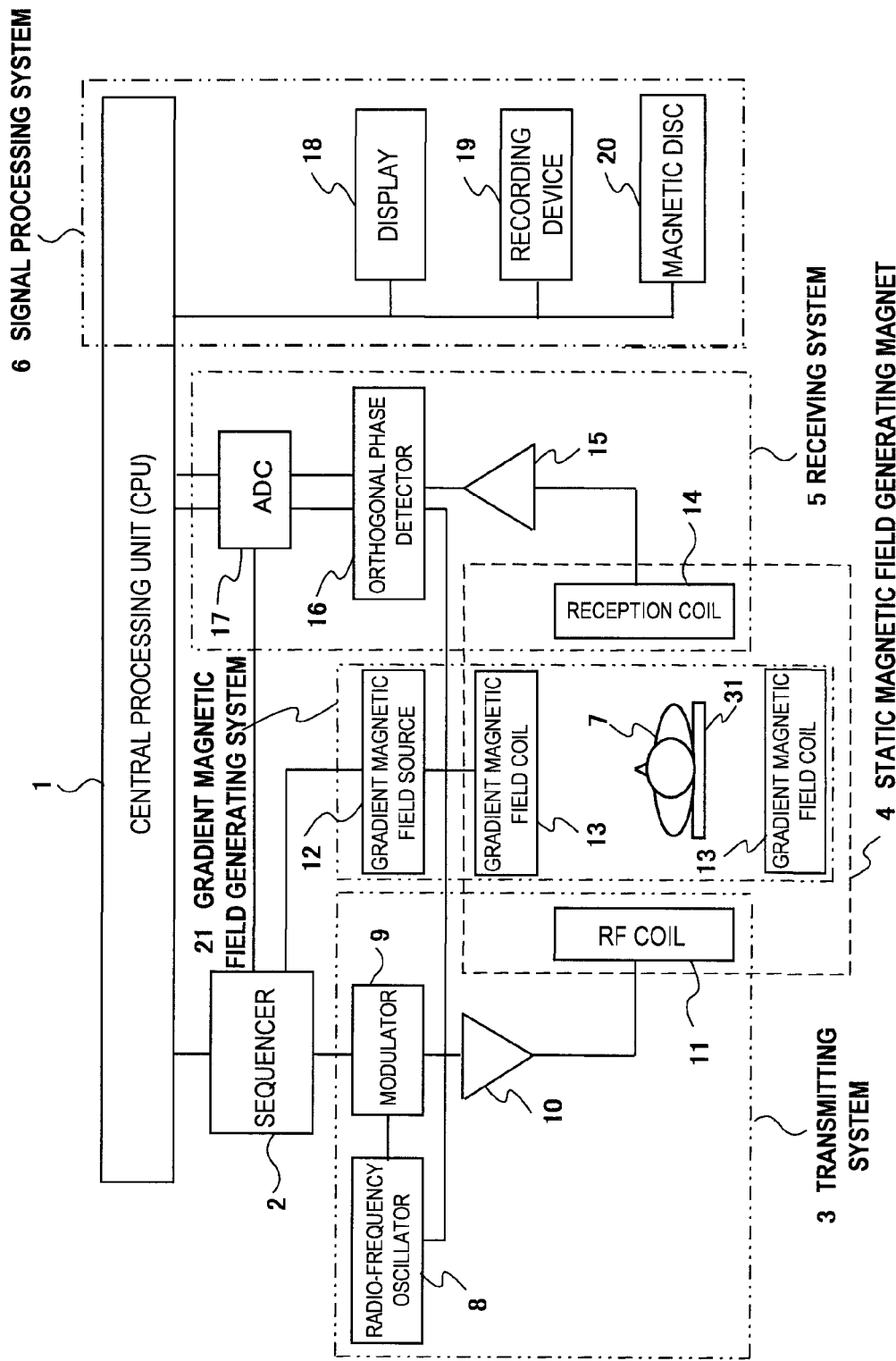
FIG. 1 is a block diagram showing the overall construction of an MRI apparatus according to a first embodiment of the invention.

The following reference numerals are utilized in the drawings:

1 . . . central processing unit (CPU), 2 . . . sequencer, 3 . . . transmission system, 4 . . . static magnetic field generating magnet, 5 . . . reception system, 6 . . . signal processing system, 11 . . . radio-frequency (RF) coil, 13 . . . gradient magnetic field coil, 33 . . . insulating groove, 51 . . . shield coil, 52 . . . main coil, 53 . . . RF shield, 54 . . . imaging space

DESCRIPTION OF BEST MODES

Embodiments according to the invention will be described hereunder with reference to the drawings. In these embodiments, a gradient magnetic field coil is partially recessed, whereby the total of the thickness of an RF coil and the thickness of a gradient magnetic field coil is reduced without lowering the magnetic field generation efficiency. That is, the RF coil can be disposed to be near to the gradient magnetic field coil side without lowering the magnetic field generation efficiency, and the distance from a cover till a magnet can be shortened as compared with prior arts.

First Embodiment

As shown in FIG. 1, an MRI apparatus of an embodiment of the invention has a static magnetic field generating magnet 4, a gradient magnetic field generating system 21, a bed 31 disposed in an imaging space while an examinee 7 is mounted thereon, a transmitting system 3 for applying a radio-frequency magnetic field to the examinee 7, a receiving system 5 for receiving an NMR signal generated by the examinee 1, a sequencer 2, a signal processing system 6 and a central processing unit (CPU) 1.

The static magnetic field generating magnet 4 generates uniform static magnetic field in the body axis direction of the examinee 7 or in a direction orthogonal to the body axis direction in an imaging space. For example, a magnetic field generating apparatus based on any one of permanent magnet type, a normal conduction type and a superconduction type may be used. The transmitting system 3 contains a radio-frequency oscillator 8, a modulator 9, a radio-frequency amplifier 10 and a radio-frequency (RF) coil 11, and the sequencer 2 controls the modulator 9 to apply predetermined radio-frequency magnetic field to the examinee 7.

A gradient magnetic field generating system 21 contains gradient magnetic field coils 13 for generating gradient magnetic fields Gx, Gy, Gz in the three directions of X, Y, Z respectively, and a gradient magnetic field power source 12 for driving the gradient magnetic field coils 13, and generates gradient magnetic field in a predetermined direction corresponding to predetermined pulse sequence control based on the sequencer 2. The gradient magnetic fields Gx, Gy, Gz determine a slice plane for the examinee 1, and they are applied at predetermined intensity and timing under the control of the sequencer 2 to add to the NMR signal positional information. A phase encoding gradient magnetic field out of the gradient magnetic fields for adding the positional information is normally repetitively applied in a pulse shape at a predetermined period while the magnetic intensity thereof is varied.

The receiving system 5 contains a reception coil 14, an amplifier 15, an orthogonal phase detector 16 and an A/D converter 17, and it detects the NMR signal received by the reception coil 14 after the NMR signal is amplified, and delivers it to CPU 1. The signal processing system 6 contains CPU 1, a display 18, a recording device 19 and an input portion 20. CPU 1 executes an image reconstructing program contained therein to perform image reconstruction on the basis of the NMR signal received from the receiving system 5. The reconstructed image is displayed on the display 18. Furthermore, it is stored in the recording device 19 as occasion demands. The input portion 20 accepts settings such as a condition of the image reconstruction from a user.

The sequencer 2 controls the transmitting system 3, the gradient magnetic field generating system 21 and the receiving system 5 according to pulse sequence information delivered from CPU 1 to execute a predetermined pulse sequence, thereby implementing various imaging methods such as a spin echo method, a gradient echo method. The pulse sequence information contains information such as the magnetic field intensities of radio-frequency pulse and gradient magnetic field pulse, timings of magnetic pulse irradiation and NMR signal detection, repetition time, and a condition set through the input portion 20 by the user or a predetermined condition is used. In all the imaging methods, the RF coil 11 and the gradient magnetic field coil 13 are repetitively driven in a pulse shape at a high speed every predetermined repetitive time on the basis of a control signal from the sequencer 2.

The structures of the magnet 4, the gradient magnetic field coils 13 and the RF coil 11 will be described hereunder with reference to FIG. 2.

The static magnetic field generating magnet 4 has a cylindrical shape, and disposed so that the axial direction thereof is coincident with the body axis direction of the examinee 7. Accordingly, the magnet 4 generates a static magnetic field in the body axial direction of the examinee 7.

Figure 2:
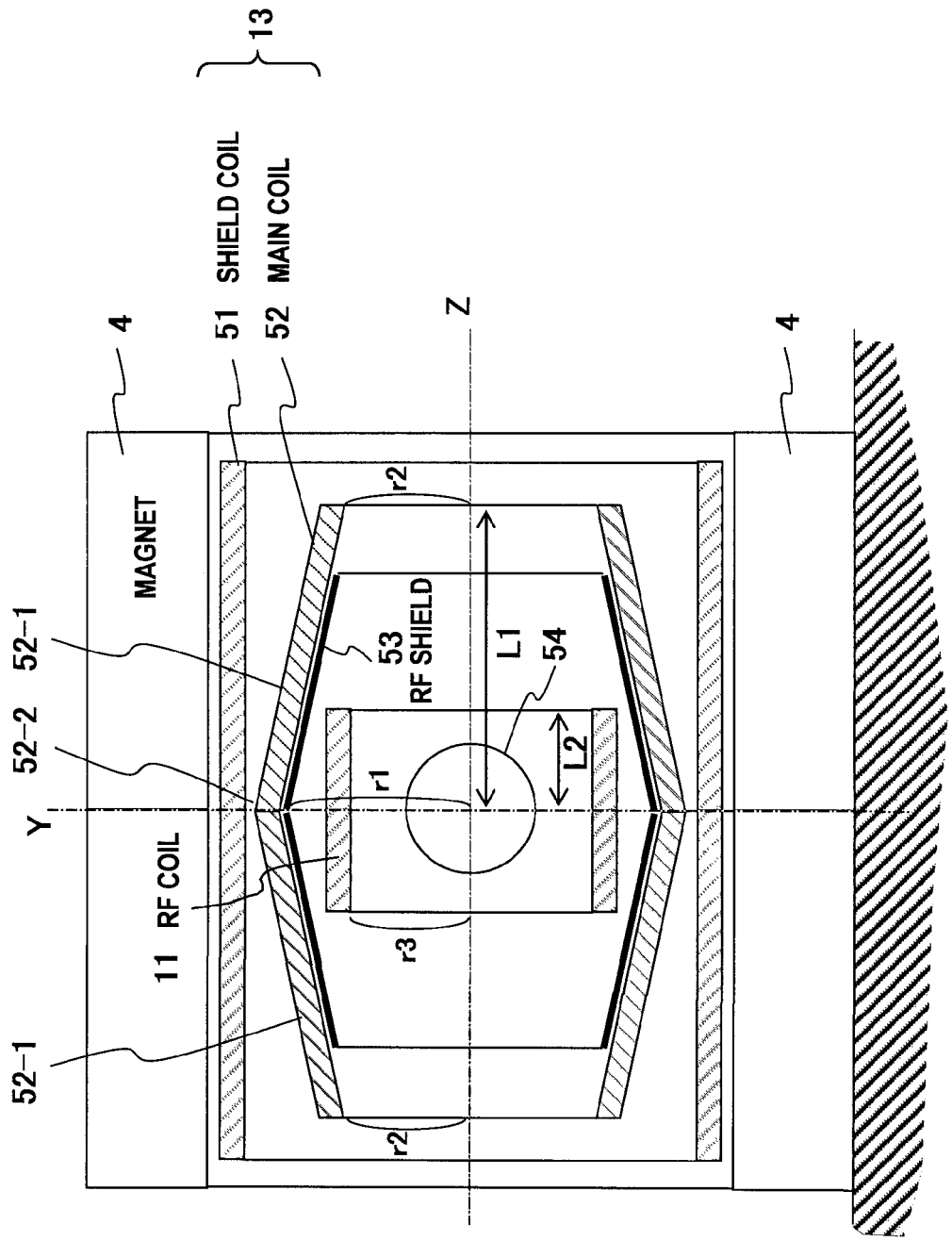
FIG. 2 is a cross-sectional view showing the construction of a magnet 4, a gradient magnetic field coil 13 and an RF coil 11 of the MRI apparatus according to the first embodiment of the invention.

As shown in FIG. 2, the gradient magnetic field coil 13 is an active shield type gradient magnetic field coil (ASGC) having a main coil 52 and a shield coil 51. The shield coil 51 is disposed between the main coil 52 and the static magnetic field generating magnet 4.

Although not shown in FIG. 2, each of the main coil 52 and the shield coil 51 is designed so that three coils are stacked and arranged. The main coil 52 is designed so that an X-direction main coil, a Y-direction main coil and a Z-direction main coil for generating gradient magnetic fields of XYZ directions respectively are stacked and arranged. The stack order of the three main coils may be set so that the X-direction main coil, the Y-direction main coil and the Z-direction main coil are successively arranged in this order from the imaging space 54 side. The shield coil 51 is designed so that X-direction, Y-direction and Z-direction shield coils for generating magnetic fields in the opposite directions to leak magnetic fields of the X-direction, Y-direction and Z-direction main coils to the static magnetic field generating magnet 4 are stacked. Accordingly, the shield coil 51 cancels the leak magnetic field to the static magnetic field generating magnet 4 to thereby suppress eddy current caused by the leak magnetic field from occurring in the container of the static magnetic field generating magnet 4. The stack order of the X-direction, Y-direction and Z-direction shield coils may be set so that the Z-direction shield coil, the X-direction shield coil and the Y-direction shield coil are successively arranged in this order from the imaging space 54 side, for example.

The X-direction, Y-direction and Z-direction shield coils are designed in a cylindrical shape, and the overall shape of the shield coil 51 obtained by stacking these shield coils is a cylindrical shape. On the other hand, the outer shape of the main coil 52 obtained by stacking the X-direction, Y-direction and Z-direction main coils is a tubular shape in which the radius (internal diameter) r1 at the center portion (Z=0) of the imaging space 54 is larger than the radius (internal diameter) r2 at both the end portions of the main coil 52 (Z=L1, Z=−L1) (r2<r1).

That is, the main coil 52 as the gradient magnetic field generating coil has a center portion 52-2 confronting the imaging space 54 in the vertical direction to the horizontal axis (Z-axis) passing through the center point of the imaging space 54, and side portions 52-1 which extend from the center portion. The distance r1 in the vertical direction between the center portion 52-2 and the horizontal axis is larger than the distance in the vertical direction between the side portions 52-1 and the horizontal axis, and also the distance concerned is reduced as the position of the main coil 52 shifts from the center portion 52-2 to the end portions of the side portions 52-1. The distance is equal to r2 at both the end portions of the main coil 52.

The radius between Z=0 and Z=L1 and between Z=0 and Z=−L is reduced with the approach to both the end portions (Z=L1, −L1) of the main coil 52. Accordingly, the main coil 52 is shaped so that two partial cones (parts of the side surfaces of the cones) are connected to each other at Z=0. When viewed from the imaging space 54 side, it is recessed at the center portion (Z=0). The X-direction, Y-direction and Z-direction main coils are designed in the same shape in which the center portions thereof shown in FIG. 2 are recessed, and these coils are stacked so that the overall shape of the main coil 52 is set to the shape of FIG. 2.

In the example shown in FIG. 2, the center portion 52-2 is designed so that two flat planes intersect with each other (two lines intersect with each other in section), however, the center portion 52-2 may be designed in a gently varying shape, for example, in a curved shape.

Figure 3:
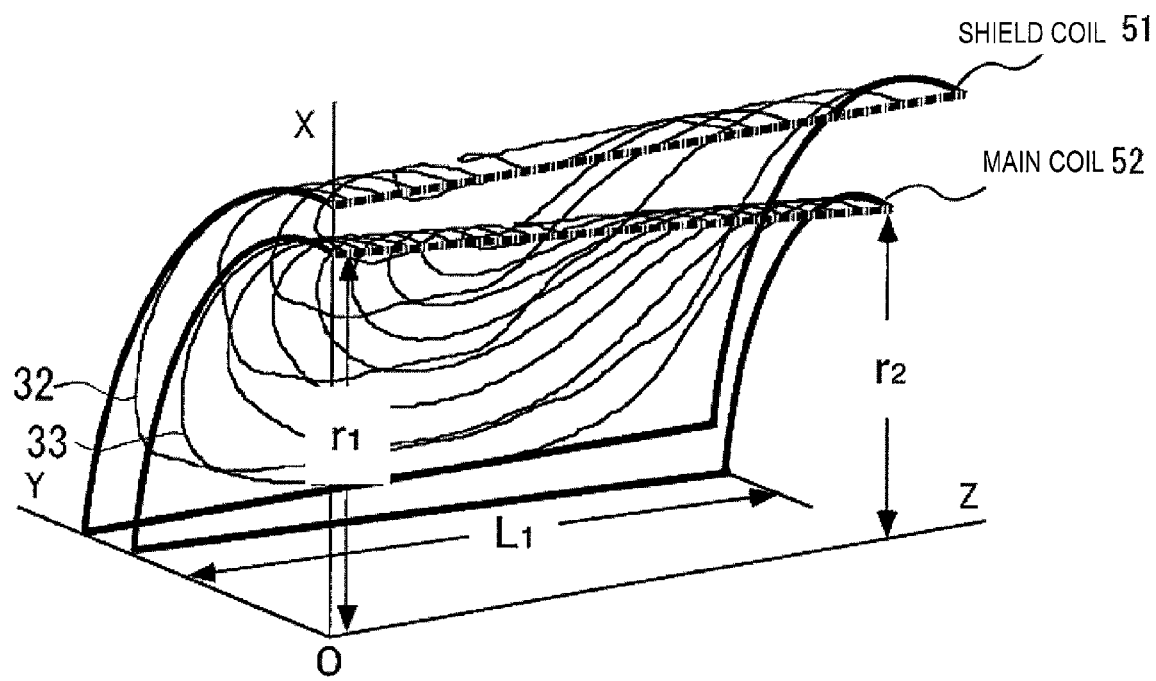
FIG. 3 is a cut-out perspective view showing the partial construction of a shield coil 51 and a main coil 52 of the gradient magnetic field coil 13 of FIG. 2.

FIG. 3 is a cut-out perspective view of the X-direction main coil of the main coil 52 and the X-direction shield coil of the shield coil 51.

In the coils of FIG. 3, predetermined tubular conductors (for example, 2 to 4 mm in thickness) are cut to form insulating grooves 32, 33 along desired streamlines to form the main coil (X-direction) 52 and the shield coil (X-direction). The insulating grooves 32, 33 may be formed by water jet work, machine work or the like, and they may be formed before or after the plate-shaped conductor is shaped into a tubular shape. Only the X-direction main coil and the X-direction shield coil are shown in FIG. 3, and with respect to the Y-direction and Z-direction main coils and the Y-direction and Z-direction shield coils, they are different in only the streamline shape of the insulating grooves, and they are identical in the outer shape. That is, with respect to the X-direction coil and the X-direction shield coil, the insulating grooves whose shapes are rotated by 90° with the Z-axis set as the rotational axis are formed on the conductor, whereby the Y-direction main coil and the Y-direction shield coil can be obtained. Furthermore, the insulating grooves which are concentric around the Z-axis are formed on the conductor, whereby the Z-direction main coil and the Z-direction shield coil can be formed.

The RF shield 53 has the same shape as the main coil 52, and disposed just at the inside of the main coil 52. The material of the RF shield 53 is non-magnetic metal such as copper, stainless, and it is formed of thin foil or mesh obtained by knitting slender wires. The RF shield 53 suppresses noises of the gradient magnetic field power source which are discharged from the gradient magnetic field coil 13, and it shields the electromagnetic coupling between the gradient magnetic field coil 13 and the RF coil 11 to reduce the induction loss, whereby the RF shield 53 has an action of enhancing Q of the RF coil 11.

A cylindrical RF coil 11 having a radius of r3 is disposed inside the RF shield 53. The end portions of the RF coil 11 are located at Z=L2, −L2 (L2<L1). The RF coil 11 may be constructed by winding a wire rod in a desired pattern or cutting insulating grooves on a tubular conductor plate.

Although not shown in FIG. 2, the elements from the RF coil 11 till the magnet 4 are covered by a resin cover, thereby forming a bore which a patient enters.

As described above, according to this embodiment, when viewed form the imaging space 54 side at the portion corresponding to the position of the imaging center portion (Z=0), the main coil 52 is recessed at the center. Therefore, as compared with the case where the main coil 52 is not recessed, an RF coil 11 having a larger diameter can be disposed, and the bore diameter can be increased. The radius r3 of the RF coil 11 may be larger or smaller than the radius r2 at the end portions of the main coil 52.

It is necessary to make lots of magnetic flux flow in the space between the main coil 52 and the shield coil 51 in order to generate magnetic flux of gradient magnetic field in the imaging space 54 and also reduce leak magnetic flux to the static magnetic field generating magnet 4. Therefore, if this space is narrow, the generation efficiency of the gradient magnetic field of the main coil 52 is lowered. That is, in order to generate the same gradient magnetic field by the same current while the space between the main coil 52 and the shield coil 51 is narrowed, it is necessary to increase the number of turns of the coil, so that the inductance is increased by the square of the number of turns. However, in this embodiment of the invention, since the main coil 52 is inclined with respect to the shield coil 51, the main coil 52 approaches to the shield coil 51 at the center portion (Z=0), however, the interval between the main coil 52 and the shield coil 51 is conversely larger at the portions near to the end portions (Z=L1, −L1). Therefore, as a whole, the generation efficiency of the gradient magnetic field is not lowered, it is unnecessary to increase the number of turns of the coil, and the inductance is not increased. Accordingly, in the embodiment of the invention, the RF coil 11 having a large diameter can be disposed without increasing the inductance of the gradient magnetic field coil 13.

It is necessary to secure a space of some degree or more between the RF coil 11 and the RF shield 53. The reason is as follows. If the RF coil 11 and the RF shield 53 approach each other, radio-frequency eddy current increases and thus the generation efficiency of the radio-frequency magnetic field is lowered. Therefore, a stronger radio-frequency amplifier 10 is required to apply the same RF magnetic field. Furthermore, the magnetic field distribution in the neighborhood of the RF coil 11 varies drastically, and thus there occurs a problem that non-uniformity of RF power in an imaging area is increased. However, in the embodiment of the invention, the RF shield 53 is inclined in the same shape as the main coil 52. Accordingly, even when the RF shield 53 approaches the main coil 52 at both the end portions of the RF coil 11 (Z=L2, Z=−L2), the interval is larger at Z=0 than that at both the end portions. Accordingly, as a whole, the generation efficiency of the radio-frequency magnetic field of the RF coil 11 is not lowered, and thus the RF shield 53 can be made to approach the main coil 52 at both the end portions of the RF coil 11 (Z=L2, Z=−L2), so that the RF coil 11 having a large radius can be disposed.

For example, the half (L1) of the length in the center axis direction of the main coil 52=500 mm, the internal diameter (r1) at the center portion=400 mm, the internal diameter (r2) at both the end portions=350 mm, the RF shield 53 is brought into close contact with the main coil 52, the half (L2) of the length in the center axis direction=250 mm, and both the end portions of the RF coil 11 having the internal diameter (r3)=350 mm can be disposed so as to be spaced from the RF shield 53 at about 25 mm.

According to the structure of the embodiment of the invention, under the condition of the same magnetic field generation efficiency and inductance, the thickness from the RF coil 11 to the magnet 4 can be reduced by about 20 mm. That is, this means that even if the internal diameter r3 of the RF coil 11 is increased by about 20 mm as compared with the case where the cylindrical main coil is used and the internal diameter r2 of the main coil 52 is set in such a range that it is not smaller than r3, substantially the same magnetic field generation efficiency and inductance performance can be obtained. Furthermore, when the thickness from the RF coil 11 to the magnet 4 is set to the same value, the inductance can be reduced by about 20 percentages.

As described above, in the embodiment of the invention, the main coil 52 is shaped so that the diameter has the maximum value at Z=0 and it is inclined with the shift to the end portions, whereby the diameter of the RF coil 11 can be increased without lowering the magnetic field generation efficiencies of both the gradient magnetic field coil 13 and the RF coil 11.

Furthermore, the main coil 52 of the embodiment of the invention is shaped so that it is recessed at Z=0 when viewed from the inside thereof, but it has a shape obtained by combining two partial cones each of which is drawn with a locus obtained by rotating a line inclining from the center to the end portion around the Z-axis by 360°. Therefore, one coil (for example, the X-direction main coil) can be manufactured from one development elevation every one-side partial cone, and thus it can be easily manufactured. By dividing the partial cone into two parts in the peripheral direction, it can be more easily manufactured, and a dividing and manufacturing method will be described below.

Figure 4:
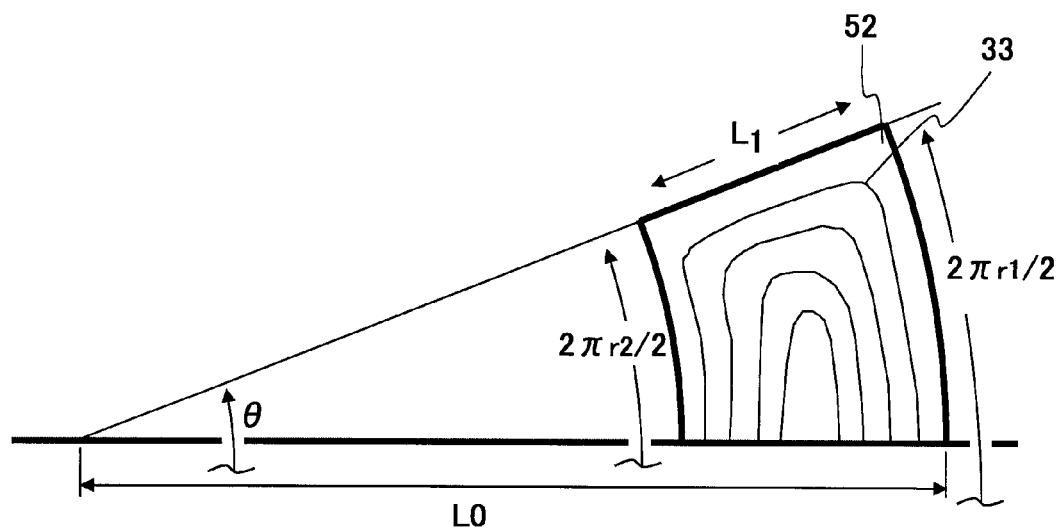
FIG. 4 is a diagram showing the shape of a part of a conductive plate for forming a main coil 52 of FIG. 3.

FIG. 4 shows a partial shape of a conductor plate constituting this partial cone. For example, in the case of L1=500 mm, r1=400 mm and r2=350 mm, it becomes a sector in which θ=18°, the radius of curvature Lo=4000 mm, the long arc is equal to ((2πr1)/2) and the short arc is equal to ((2πr2/2). By bending this conductor plate in a partial cone shape, a half portion in the peripheral direction of the main coil 52 is formed. The insulating grooves 33 may be formed under the state of the conductor plate or after the conductor plate is bent in the partial cone shape. After the parts of the main coil 52 of totally four pieces are formed, these pieces are connected to one another to manufacture the X-direction main coil. Likewise, the parts of the Y-direction and Z-direction main coils are formed, and the three coils are assembled to be stacked.

At this time, in the embodiment of the invention, the insulating grooves 33 are formed so as to constitute coils which are closed (independent) every conductor plate (the half in the peripheral direction of the partial cone). Accordingly, when this one-side partial cone is connected to the end portion of the other one-side partial cone which is likewise constructed, it is unnecessary to electrically connect the connection portions thereof, but lead wires or the like may be connected to the end portions of the coils of the respective partial cones and also connected to one another in series. When the one-side partial cone is formed by one conductor plate, the insulating grooves are also formed so as to construct the coils which are closed every conductor plate.

When the main coil 52 is assembled, it is combined with the shield coil 51 while they are positioned to each other, and solidified by resin mold or the like to thereby form the gradient magnetic field coil. The partially-conical RF shield 53 may be stacked and built up on the inside of the main coil 52 in the manufacturing process, or attached to the inside of the main coil 52 after the gradient magnetic field coil is manufactured.

The gap between the RF shield 53 and the RF coil 11 may be vacant as a space if it is not filled with any material inductive to the RF coil 11, or it may be molded with resin or the like.

The diameter r3 of the RF coil 11 may be larger or smaller than the diameter r2 of the narrow portion of the main coil 52. However, in the case where r3 is larger than r2, the RF coil 11 is disposed in advance when the gradient magnetic field coil 13 is assembled, or the RF coil 11 is configured to be dividable and after the gradient magnetic field coil 13 is assembled, the RF coil 11 is inserted into the inside of the main coil 52 under the divided state and then assembled.

As described above, according to the first embodiment of the invention, by combining the two partial cones with each other, the structure which is constructed by slant surfaces, but recessed at the center portion of the main coil 52 can be obtained. Therefore, as described above, the insulating grooves 33 are formed so as to construct the coils which are independent every two partial cones constituting the main coil 52 or every part constituting the partial cone.

Figure 13:
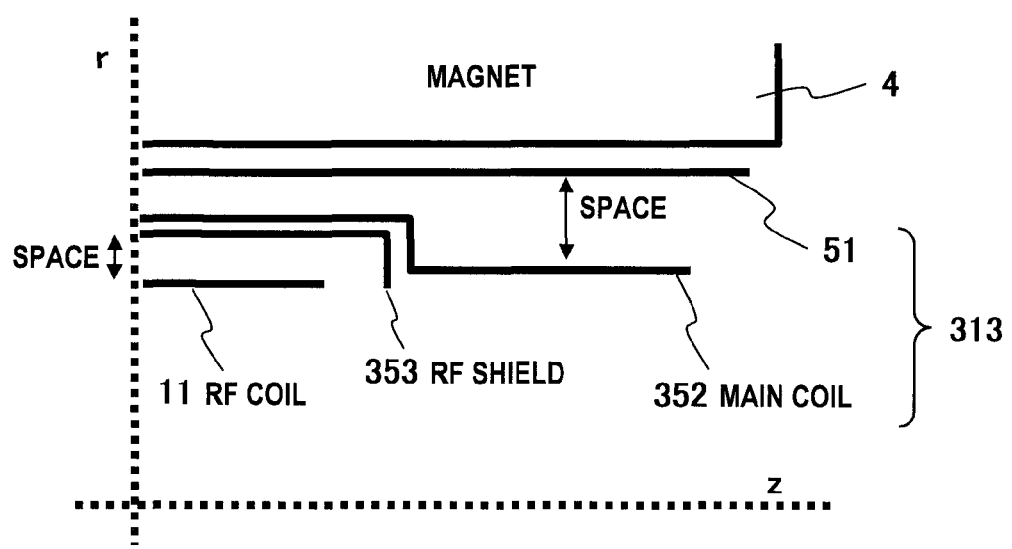
FIG. 13 is a cross-sectional view showing the construction of a magnet 4, a gradient magnetic field coil 313 and an RF coil 11 of an MRI apparatus of a comparative example.
Figure 14:
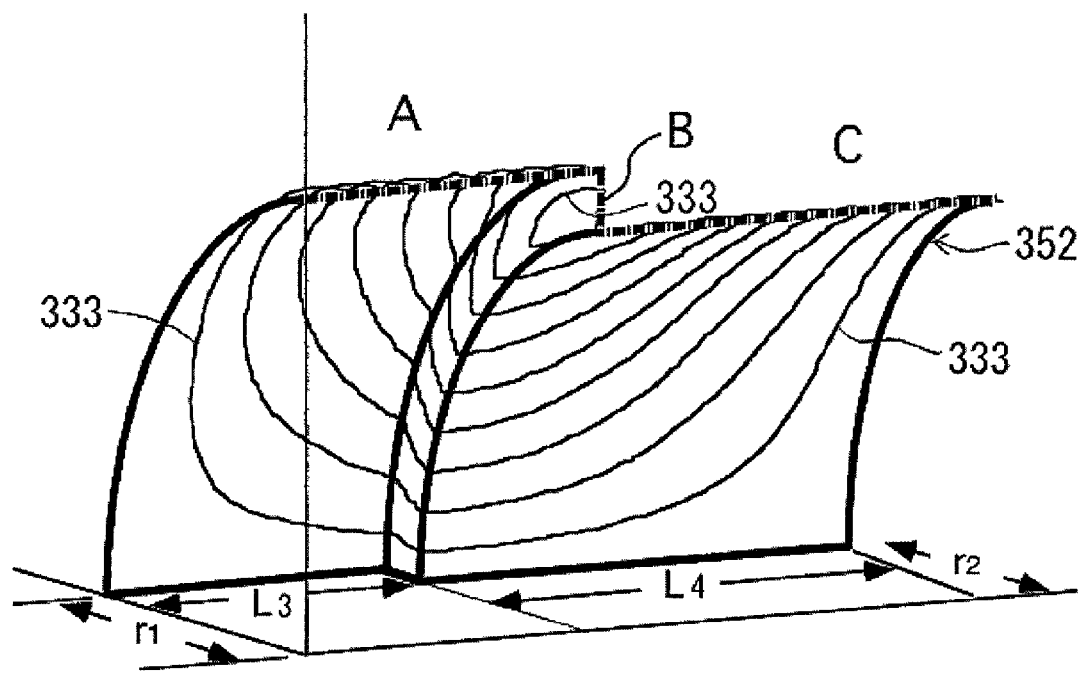
FIG. 14 is a cut-out perspective view showing a partial construction of a main coil 532 of the gradient magnetic field coil 13 of FIG. 13.
Figure 15:
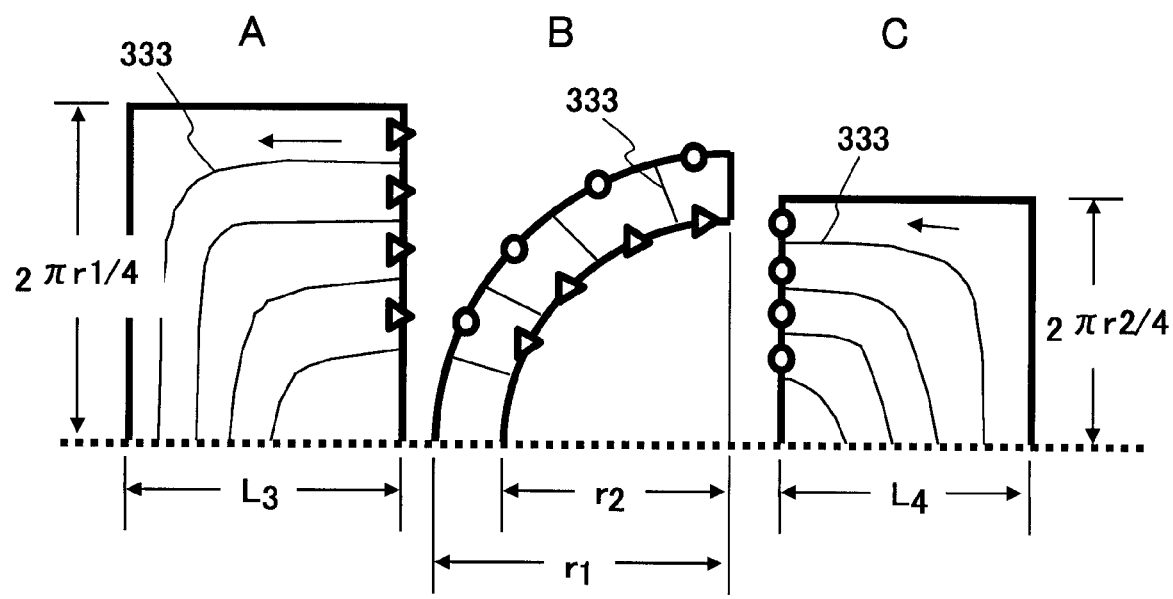
FIG. 15 is a diagram showing the shape of a part of a conductive plate for forming a main coil 352 of FIG. 14.

A case where a main coil 352 is recessed by providing a step as shown in FIG. 13 will be described as a comparative example. In the main coil 352 provided with the step, it is necessary to connect many conductors at the step portion, and it cannot be easily manufactured from the problem on the manufacturing process. Specifically, in the case of the main coil 352 having a step as shown in FIG. 13, it is necessary to provide an insulating groove 333 continuously at the step portion as shown in the cut-out perspective view of FIG. 14. Therefore, in the manufacturing process, it is necessary to divide the conductor plate into three plate members of parts A, B, C and then providing the insulating grooves 333 on the respective parts A, B, C as shown in FIG. 15. Thereafter, the parts A and C are bent in a cylindrical shape, and then connected to the part B to obtain the shape of FIG. 14. When the part A, the part B and the part C are connected to one another, the parts of ○ and Δ in FIG. 15 are electrically connected to each other to thereby obtain a coil of FIG. 14. In the normal coil pattern, the number of the points (the parts of ○ and Δ) to be connected extend to several hundreds when the gradient magnetic field coil 213 of FIG. 14 is formed. Therefore, it is not easy to manufacture the gradient magnetic field coil 213 while connecting these points.

As compared with this comparison example, the main coil 52 of this embodiment of the invention is configured to be recessed at the center portion thereof as in the case of the comparison example, however, there is a merit that it can be easily manufactured.

In this embodiment of the invention, the RF coil 11 is designed in a cylindrical shape. However, the invention is not limited to this shape, and it may be designed in other shapes.

In the first embodiment, the RF coil 11 for irradiation and the reception coil 14 are separately provided. However, the RF coil 11 of this embodiment of the invention may also serve as the reception coil 14.

In the first embodiment, by forming the insulating grooves on the conductor plate, the coils of the respective directions constituting the main coil and the shield coil are manufactured. However, the invention is not limited to this style. The main coil and the shield coil may be formed by winding a copper wire rod, a plate or a pipe if the outer shape corresponds to the shape described above.

The foregoing description has been made under the state that the gradient magnetic field generating coil 52 is assembled in the magnetic resonance imaging apparatus. However, the gradient magnetic field generating coil 52 as a single body may be a part of the magnetic resonance imaging apparatus.

The gradient magnetic field generating coil according to the invention has the center portion forming the center space area, and side portions which extend from the center portion and form side space areas (space areas located at both the sides of the center space area), the dimension (r1) of the center space area in the direction orthogonal to the center axis (Z-axis in the example of FIG. 2) passing through the center of the center space area is larger than the dimension (r2) of the side space areas in the direction orthogonal to the center axis (Z axis), and the dimension is continuously reduced with the shift from the center of the center portion to the outside end portions of the side portions.

Second Embodiment

A second embodiment according to the invention will be described with reference to FIGS. 5 to 8. The second embodiment is identical to the first embodiment in that the center portion 52-2 (Z=0) of the main coil 52 is recessed and the radius r2 of the center portion 52-2 is larger than the radius r1 of the end portions, however, it is different from the first embodiment in that the main coil 52 is divided into a cylindrical member 52-1 (side portion) of radius r1 and a cylindrical member 52-2 (center portion) of radius r2. Accordingly, the radius of the main coil 52 is reduced stepwise (in a staircase pattern) with the approach from the center portion Z=0 to the end portions Z=L1.

That is, in the gradient magnetic field coil comprising the main coil 52 for generating the gradient magnetic field in the imaging space and the shield coil 51 for generating the magnetic field cancelling the leak magnetic field from the main coil 52 to the opposite side to the imaging space, the main coil 52 has a center portion 52-2 and side portions 52-1 which are disposed at the end portion sides of the center portion 52-2 so as to be separated from the center portion 52-2, and at least parts of the end portions of the center portion 52-2 are overlapped with at least parts of the end portions at the center portion 52-2 side of the side portions 52-1, and the distance in the vertical direction between the main coil 52 and the horizontal axis passing through the center point of the imaging space is stepwise reduced from the center portion 52-2 to the side portion 52-1.

Figure 5:
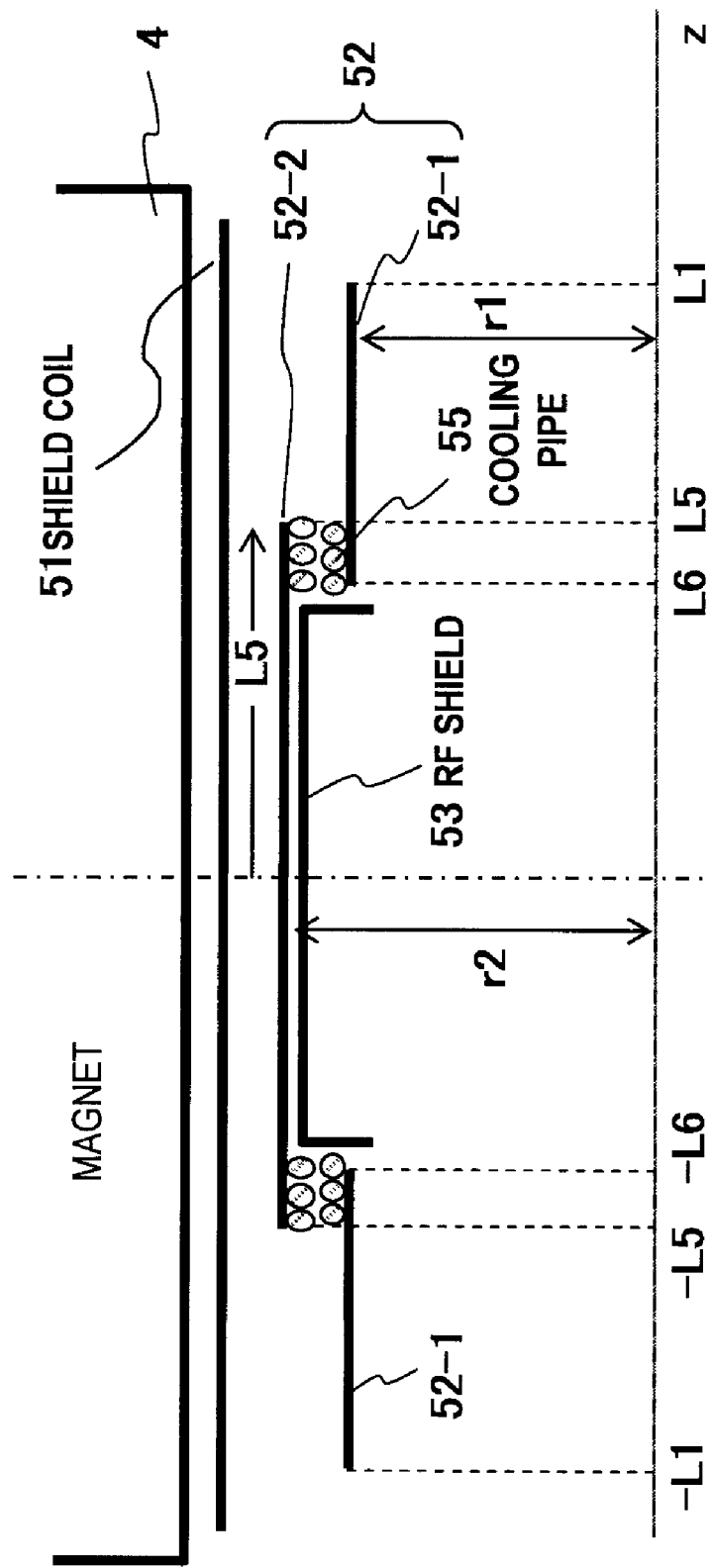
FIG. 5 is a diagram showing the construction of a magnet 4, a gradient magnetic field coil 13 and an RF shield 53 of an MRI apparatus according to a second embodiment of the invention.

The RF shield 53 is disposed along the recess inner wall of the center portion 52-2 of the main coil 52 as shown in FIG. 5. Although not shown in FIG. 5, the RF coil 11 is disposed in the recess portion (the portion of the center portion 52-2) of the main coil 52. The other construction is the same as the first embodiment.

The structure of the main coil 52 will be specifically described. As shown in FIG. 5, the end portions of the center portion 52-2 of the main coil 52 are located at Z=−L5, L5. The side portions 52-1 are disposed at both the outer sides thereof. The end portions of the side portion 52-1 located at the positive Z side are located at Z=L6, Z=L1. The end portions of the side portion 52-1 located at the negative Z side are located at the symmetrical positions with Z=L6, Z=L1. At this time, L5 and L6 are set so as to satisfy |L5|>|L6|, and the center portion 52-2 are overlapped with the side portions 52-1 at both the sides between L6 and L5 (−L6 and −L5). That is, the end portions of the center portion and the end portions at the center portion side of the side portions are partially overlapped with one another in the vertical direction.

Figure 6:
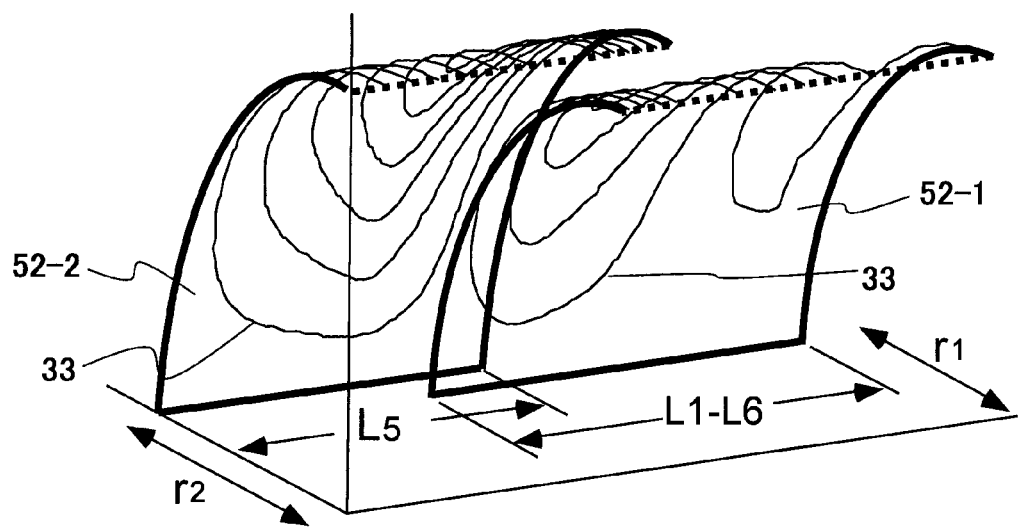
FIG. 6 is a cut-out perspective view showing a partial construction of the main coil 52 of the gradient magnetic field coil of FIG. 5.
Figure 7:
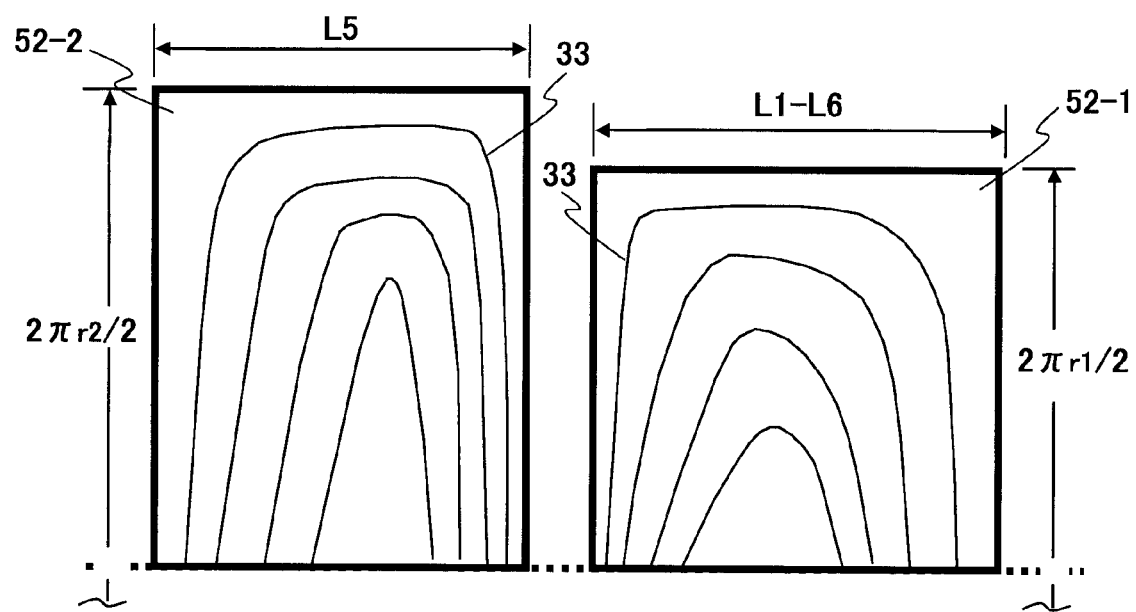
FIG. 7 is a diagram showing the shape of a part of a conductive plate for forming the main coil 52 of FIG. 4.

Insulating grooves 33 are formed so that two side portions 52-1 and one center portion 52-2 respectively form independent (closed) coils as shown in FIGS. 6 and 7. Accordingly, lead wires or the like may be connected to the end portions of the coils of the side portions 52-1 and the center portion 52-2 and connected to one another in series.

The side portions 52-1 and the center portion 52-2 can be manufactured by bending conductor plates having shapes as shown in FIG. 7 (in FIG. 7, only parts of the conductor plates are shown).

Figure 8A:
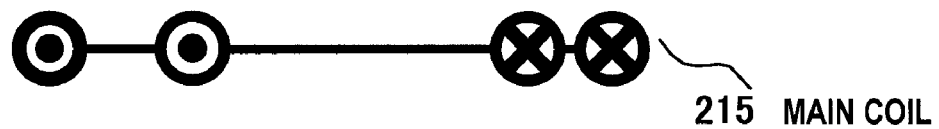
FIG. 8A is a diagram showing current flowing through a conventional main coil 215 which is not recessed at the center thereof.
Figure 8B:
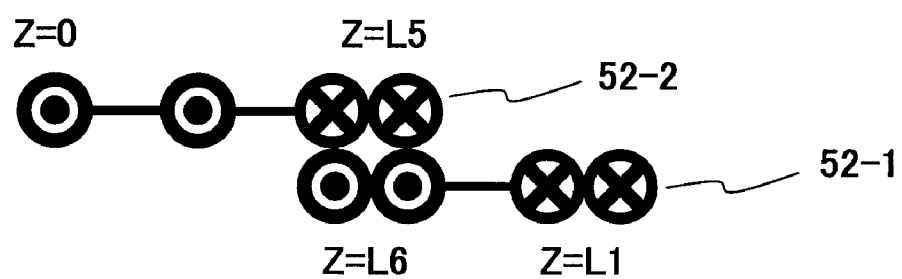
FIG. 8B is a diagram showing current flowing in the main coil 52 of the second embodiment of the invention.

The current flowing in the main coil 52 constructed as shown in FIG. 5 and the magnetic flux will be described with reference to FIG. 8B. The cross-section of the main coil 215 which is designed not to be recessed at the center thereof is shown as a comparative example in FIG. 8A, and X marks represent that current flows from the front side to back side with respect to the paper surface, and filled circles represent that current flows from the back side to the front side with respect to the paper surface. The main coil 52 of FIG. 5 of this embodiment is divided into the side portions 52-1 and the center portion 52-2. Accordingly, when current is made to flow, the current flows as shown in FIG. 8B. Current increases in the neighborhood of the divided portions in proximity to Z=L5, L6, however, the magnetic flux formed by the current flowing from the front side to the back side with respect to the paper surface at the center portion 52-2 and the magnetic flux formed by the current flowing from the back side to the front side with respect to the paper surface at the side portions 52-1 are offset with each other. Therefore, a magnetic field distribution near to the main coil 215 of FIG. 8A can be obtained. However, as is apparent from FIG. 8B, in the case of this embodiment, the current density in the neighborhood of Z=L5, L6 is higher as compared with the non-divided main coil 215, and thus it is desired that a cooling pipe 55 of water cooling type or the like is disposed between the side portion 52-1 in the neighborhood of Z=L5 to L6 and the center portion 52-2 to cool heating caused by current.

In the case of this embodiment, the current densities of both the side portion 52-1 and the center portion 52-2 increase in the neighborhood of L5-L6. For the increase of the current density, it is necessary to enhance the cooling performance. In addition, the electromagnetic force per unit cross-sectional area also increases, and thus a stronger conductor fixing structure is also required. However, remarkable enhancement of adhesion force is not expected insofar generally usable level of epoxy adhesive agent is used, and thus the upper limit of the current density is settled from the viewpoint of the adhesive force. The width of L5-L6 may be set so as to satisfy the upper limit of the current density which is settled as described above.

For example, under the condition of the current density of 100 A/mm as the upper limit, 500 A/turn and 10 turns, at least 500 mm+width of insulating groove is required as the width of L5-L6.

With respect to the current flowing in the neighborhood of L5-L6, the current total amount is varied in accordance with a portion of the original current pattern to be divided. That is, with respect to current flowing over a dividing line, current in the neighborhood of L5, L6 of the side portion 52-1, the center portion 52-2 is required as the current. Accordingly, when the current pattern is divided in the neighborhood of the center of the eddy in FIG. 14, a lot of current is required to flow in the neighborhood of L5, L6. Conversely, when the current pattern is divided at a place spaced from the center, current closed in each area is not varied even by the division, and thus current in the neighborhood of L5-L6 is not so increased.

The difference in radius between the side portion 52-1 and the center portion 52-2, that is, the difference between r1 and r2 is desired to be equal to about 30 mm because the RF coil and the RF shield are disposed there. However, if this interval is large, current in the neighborhood of L5 in FIG. 8B and current in the neighborhood of L6 in FIG. 8B do not perfectly cancel each other. In order to reduce this effect, it is required to reduce r1 and r2 or reduce current in the neighborhood of L5, L6.

Figure 8C:
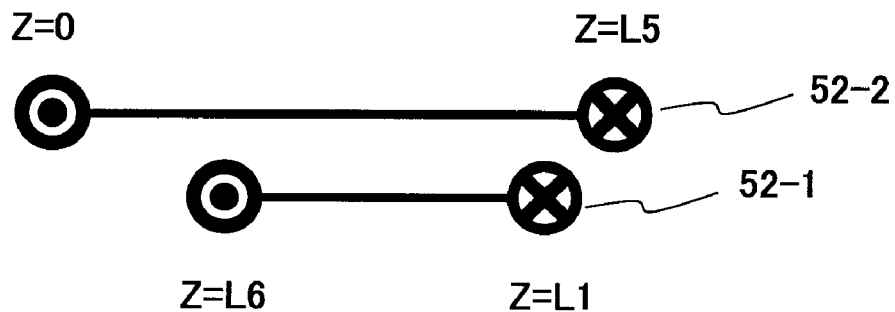
FIG. 8C is a diagram showing current flowing in the main coil 52 according to the second embodiment of the invention.

In the construction of FIG. 5, as shown in FIG. 8C, if the center portion 52-2 has an extension portion so as to cover the side portion 52-1 and |L5|>|L1| is set, the end portions (Z=L5, −L5) of the cylindrical member (center portions) 52-2 could be located at the outside of the outer end portions (Z=|L1|) of the cylindrical members (side portions) 52-1. In this case, the center portion 52-2 of the cylindrical member having the radius r2 covers the overall outside of the side portions 52-1 of the radius r1.

The current flowing in the thus-constructed main coil 52 and the magnetic flux will be described with reference to FIG. 8C. In the case of FIG. 8C, there occurs no current flowing in the opposite directions while the side portion 52-1 and the center portion 52-2 approach each other unlike FIG. 8B. Accordingly, there is a merit that the current density is reduced and heating is reduced.

In the second embodiment, the main coil 52 is divided into plural members 52-1, 52-2 and the center portion thereof is recessed. Accordingly, as in the case of the first embodiment, the RF coil 11 can be disposed to be near to the gradient magnetic field coil side without lowering the magnetic field generation efficiency, and the distance from the RF coil 11 to the magnet 4 can be shortened as compared with the prior art.

Furthermore, in the second embodiment, the main coil 52 is divided into plural cylinders, and thus it has a merit that it is unnecessary to perform the bending work for the tapered shape to form the partial cone which is required in the first embodiment. On the other hand, the current density may increase as in the case of FIG. 8B, and thus it is necessary to enhance the cooling performance around there. For example, as shown in FIG. 5, a cooling pipe 55 for making cooling water flow is concentratively disposed between the main coils 52-1, 52-2 to cool the neighborhood, that is, the cooling pipe (cooling means) 55 for cooling the main coil 52 as the gradient magnetic field generator is disposed between the end portion of the center portion 52-2 and the end portion at the center portion 52-2 side of the side portion 52-1 which are overlapped with each other. Or, the wire rod of the Z-direction gradient magnetic field coil may be constructed by a hollow conductor through which water can be passed, and disposed in place of the cooling pipe 55, whereby cooling can be performed.

In the above embodiment, the main coil is divided into three parts, that is, one center portion and two side portions. However, another effect can be obtained by combining well-known techniques to increase the dividing number. JP-A-2002-112977 is cited for reference.

This publication discloses an effect that a third coil is disposed between the main coil and the shield coil to reduce the leak magnetic field from the end portion of the gradient magnetic field coil. In an active shield type gradient magnetic field coil, the current densities of the main coil and shield coil are determined so that the magnetic flux densities which are inversely proportional to the square of the distance cancel each other at a plane to be shielded. However, actually, the current of the gradient magnetic field coil is made discrete every unit wire, and thus leak magnetic field which has not yet been canceled occurs at the end portion of the gradient magnetic field coil. Particularly, in this embodiment, the interval between the main coil and the shield coil at the center portion is reduced, however, the interval between the main coil and the shield coil at the side portions is increased, so that the effect is greatly reflected in the leak magnetic field at the end portion.

In the technique of the above publication, a disc type gradient magnetic field coil for a vertical type MRI apparatus is targeted. However, the same idea is applicable to the cylindrical type gradient magnetic field coil of this embodiment. When the technique described in the above publication is applied to this embodiment, the main coil 52 is further provided with coil portions at the end portions of the side portions 52-1 at the opposite sides to the center portion 52-2 so that the distance in the vertical direction of the coil portion from the horizontal axis described above is smaller than that of the side portions 52-1. For example, two divided coils are disposed at the further end portion sides in the Z-direction from the side portions 52-1 of the main coil, and the main coil 52 is divided into totally five parts. The coils at the farthest points have several turns, and the demerit that the inductance of the overall coils increases can be suppressed.

Third Embodiment

Figure 9:
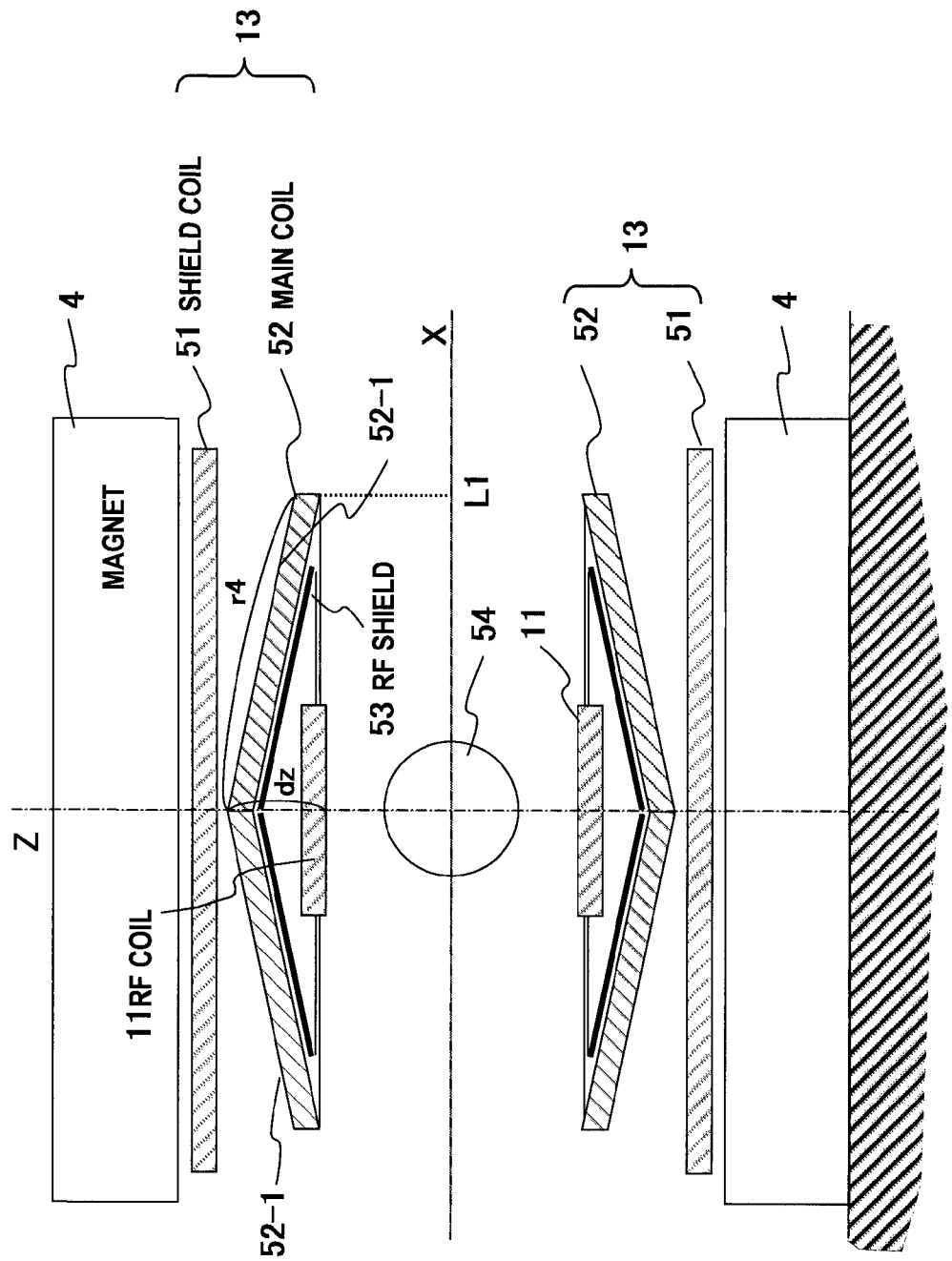
FIG. 9 is a cross-sectional view showing the construction of a magnet 4, a gradient magnetic field coil 13 and an RF coil 11 of an MRI apparatus according to a third embodiment of the invention.

A vertical (or horizontal) magnetic field type MRI apparatus in which respective pairs of magnets 4, gradient magnetic field coils 13 and RF coils 11 are disposed so as to sandwich an imaging space 54 therebetween will be described as a third embodiment with reference to FIG. 9. In FIG. 9, the elements having the same actions as the constituent elements of FIG. 2 of the first embodiment are represented by the same reference numerals.

In the third embodiment of the invention, as shown in FIG. 9, the magnets 4, the shield coils 51 and the RF coils 11 are respectively designed in the form of paired disc shape. The pair of main coils 52 confront each other through the imaging space, and each of them is designed in a conical surface (cone side surface) shape. Accordingly, the interval between the pair of main coils 52 is largest at the center portion 52-2 of the imaging space (Z=0), and continuously reduced with the shift to the end portions of the side portions 52-1 of the main coil 52 (Z=L1, −L1). The RF shield 53 has the same shape as the main coil 52, and it is disposed just at the inside of the main coil 52. This embodiment is identical to the first embodiment in that each of the main coil 52 and the shield coil 51 has the stack structure of three coils in the respective directions.

According to this construction, the pair of main coils 52 are inclined and recessed at the center portions thereof. As in the case of the first embodiment, the RF coils 11 can be disposed to be near to the gradient magnetic coil 13 side and the distance from the RF coil 11 to the magnet 4 can be shortened as compared with the prior art without lowering the magnetic field generation efficiency.

Figure 10:
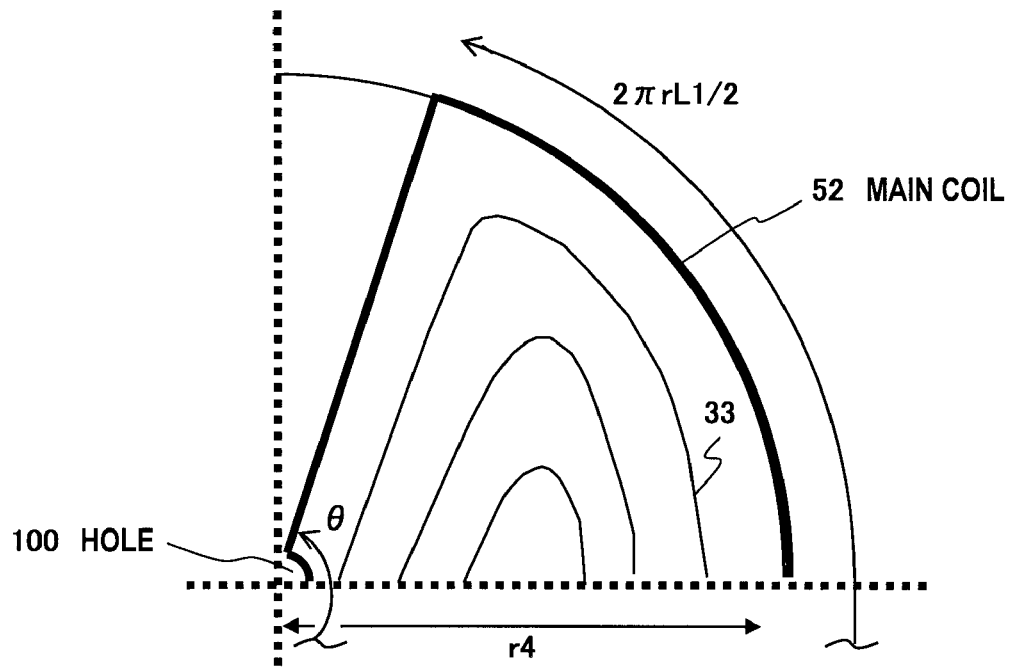
FIG. 10 is a diagram showing the shape of a part of a conductive plate for forming the main coil 52 of FIG. 9.

The main coil 52 as shown in FIG. 9 can be manufactured by bending an sectorial conductor plate (however, FIG. 10 shows only a part of the sectorial conductor plate). The dimensional relationship of the respective parts is as follows.

$r4^2 = L1^2 + dZ^2$ $\theta = 360 \cdot L1/r4$

Here, dZ represents the recess amount of the main coil 52, and θ represents the center angle of the sector. In the case of L1=400 mm and dZ=50 mm, the center angle θ of the sector is equal to about 89.3°.

With respect to the main coil 52 and the RF shield 53, the bending radius thereof is infinitely small at the apex of the cone, and in order to avoid this, a hole 100 may be provided at the apex portion. The other construction is the same as the first embodiment, and the description thereof is omitted.

Fourth Embodiment

Figure 11:
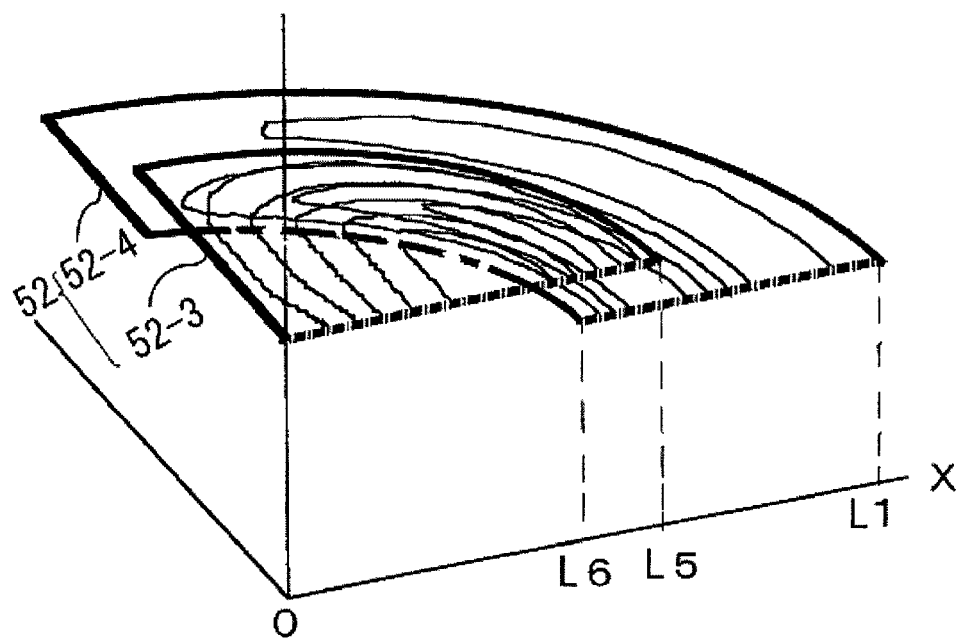
FIG. 11 is a cut-out perspective view showing a partial construction of the main coil 52 of a gradient magnetic field coil 13 according to a fourth embodiment of the invention.

In the third embodiment described above, the main coil 52 of the vertical (or horizontal) magnetic field type MRI apparatus is designed in the conical surface shape. In the fourth embodiment of the invention, the main coil 52 is divided into plural members as in the case of the second embodiment. Specifically, as shown in FIG. 11, the main coil 52 is divided into a circular disc member 52-3 having a radius L5, and a ring member 52-4 having an internal diameter L6 and an outer diameter L1. However, |L5|>|L6| is set as in the case of the second embodiment, and the circular disc member 52-3 and the ring member 52-4 are partially overlapped with each other. A cooling pipe may be disposed at the overlap portion as in the case of the second embodiment.

Figure 12:
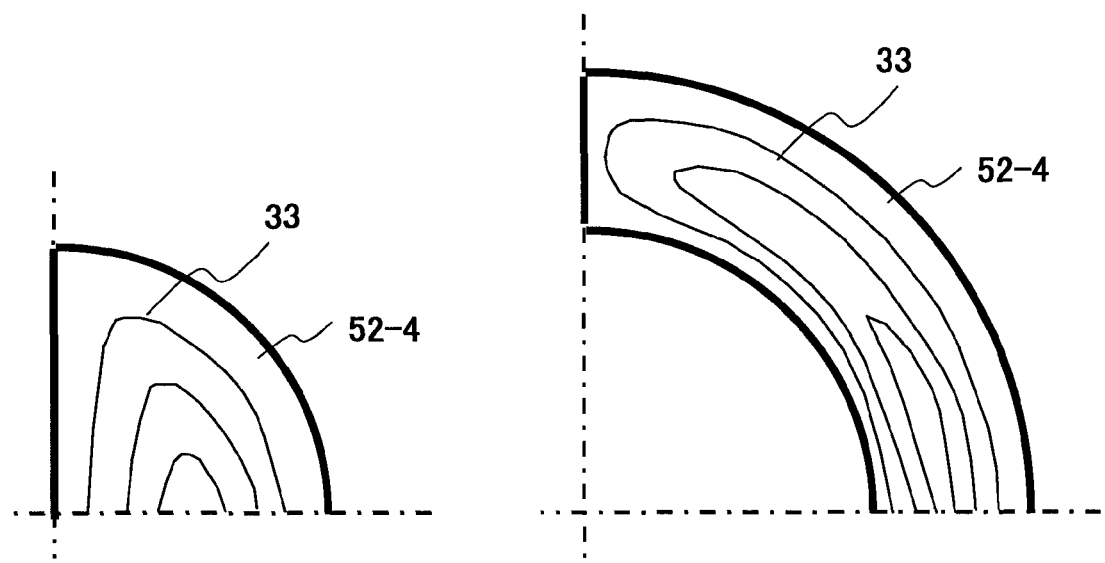
FIG. 12 is a diagram showing the shape of a part of the conductive plate for forming the main coil 52 of FIG. 11.

As shown in FIG. 12, the coil formed in the circular disc member 52-3 by the insulating grooves 33 provided on the circular disc member 52-3 and the coil formed in the member 52-4 by the insulating grooves 33 provided on the ring member 52-4 are independently of each other.

Furthermore, the main coil may be constructed so that |L5|>|L1| is set and the circular disc member 52-3 covers the overall outside of the ring member 52-4.

The main coil 52 of the fourth embodiment is not required to be bent unlike the main coil 52 of the third embodiment, and thus it can be relatively easily manufactured. Furthermore, as in the case of the third embodiment, the RF coil 11 can be disposed to be near to the gradient magnetic field coil side without lowering the magnetic field generation efficiency, and thus the distance from the RF coil 11 to the magnet 4 can be shortened as compared with the prior art.

Figure 16:
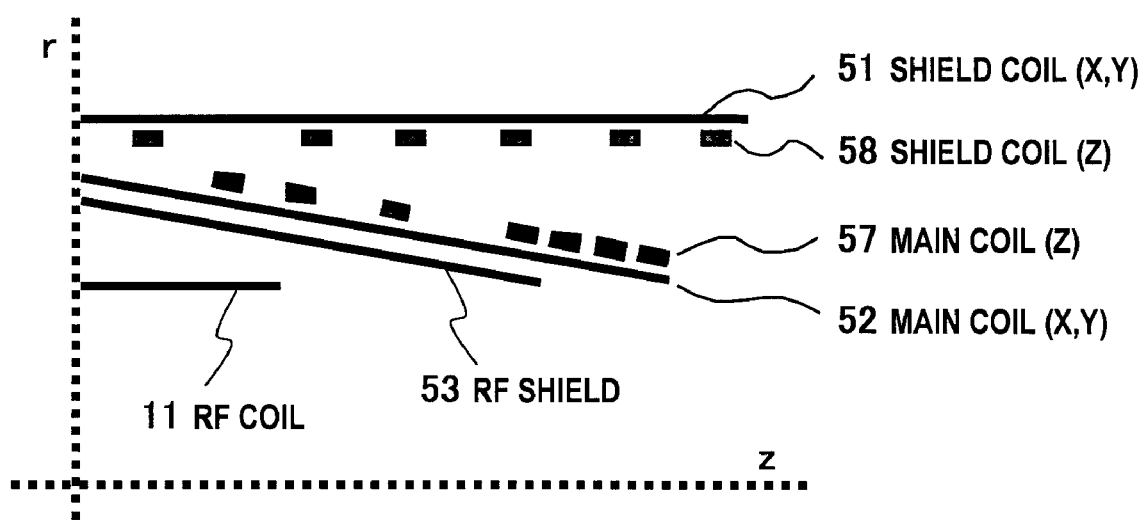
FIG. 16 is a diagram showing the construction of a Z-direction gradient magnetic field coil in the invention.

The X or Y gradient magnetic field coil is described above. The invention can be implemented in another channel constituting the gradient magnetic field coil, that is, the Z gradient magnetic field coil. The Z gradient magnetic field coil will be described with reference to FIGS. 16 and 17. FIG. 16 is a diagram showing the construction of the Z gradient magnetic field coil, and FIG. 17 is a cross-sectional perspective view showing the Z gradient magnetic field coil.

Figure 17:
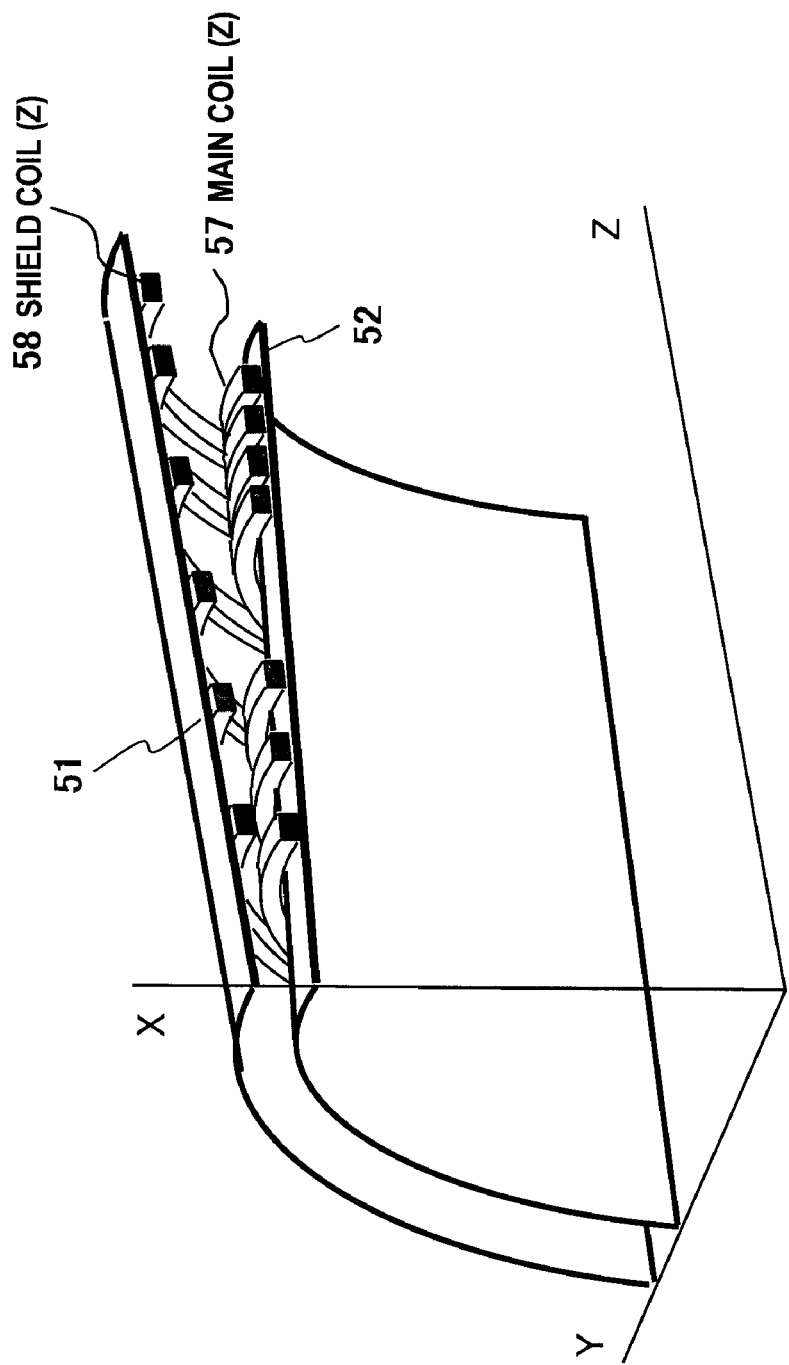
FIG. 17 is a diagram showing the construction of the Z-direction gradient magnetic field coil in the invention.

In FIGS. 16 and 17, the main coil and the shield coil constituting the Z gradient magnetic field coil do not have a fingerprint pattern, but they are constructed by concentric conductor plates unlike the X, Y gradient magnetic field coils. In general, the coil is constructed by using a copper strip having a rectangular cross section or a copper wire or winding a perforated conductor which serves as means for cooling the gradient magnetic field coil by making cooling water through the conductor.

As compared with the X, Y gradient magnetic field coils, the Z gradient magnetic field coil has a high magnetic field generation efficiency, and thus it is satisfied although the interval between the main coil 57 and the shield coil 58 of the Z gradient magnetic field coil is relatively small. In many cases, it is disposed inside the X, Y main coil 52 and shield coil 51. Although not shown, the conductor is disposed at a predetermined position by using a tool or spacer for positioning the conductor.

The Z gradient magnetic field coil described above can be implemented without being greatly changed even when it is cylindrical or conical.

Fifth Embodiment

In the example described above, the gradient magnetic field coil is linearly inclined or stepwise constructed from the center portion toward the direction to the end portions. However, in the fifth embodiment of the invention, the gradient magnetic field coil is inclined in a curved shape.

The gradient magnetic field coil conductor is based on the assumption of use of a non-stretchable thin plate which can be bent, but cannot stretch and shrink. However, it is not difficult to process a conductor of several mm constituting a gradient magnetic field coil by expanding/shrinking the conductor to form a curved surface if machine tools which have been manufactured at present are used.

Figure 18:
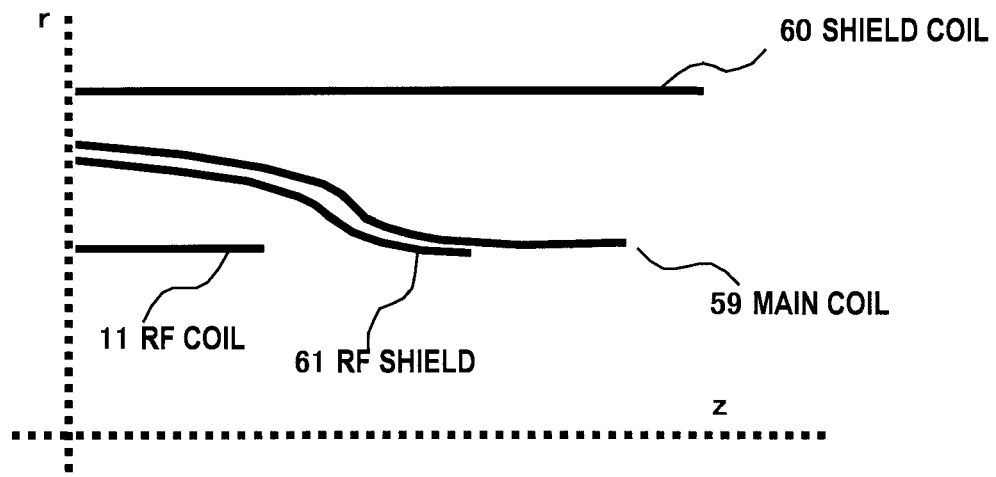
FIG. 18 is a diagram showing the construction of a gradient magnetic field coil according to a fifth embodiment of the invention.
Figure 19:
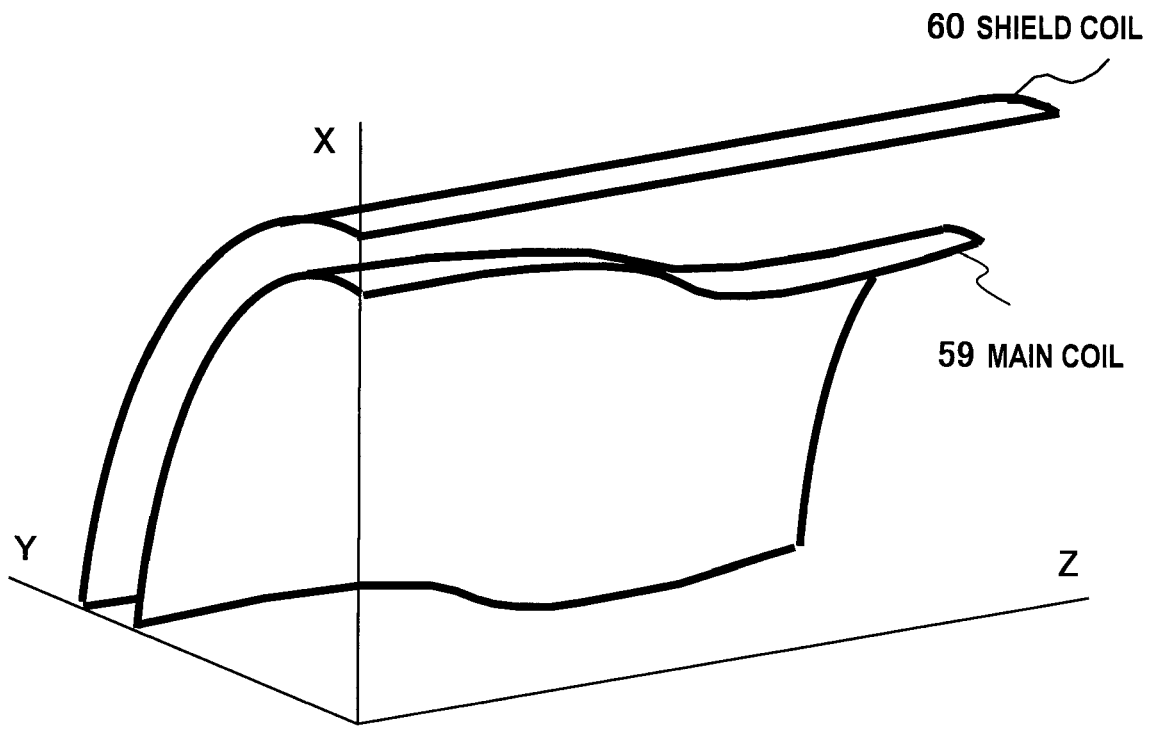
FIG. 19 is a diagram showing the construction of the gradient magnetic field coil according to the fifth embodiment of the invention.

Therefore, the curved surface is formed by expanding/shrinking the conductor of several mm, there is constructed a gradient magnetic field coil having a curved surface as shown in FIG. 18 and FIG. 19. In FIGS. 18 and 19, curved-surface type main coil 59 and RF shield 61 are constructed between a linear shield coil 60 and a linear RF coil 11. The distance of the curved-surface type main coil 59 from the shield coil 60 is gradually increased from the center portion to the end portions.

By shaping the main coil of the gradient magnetic field coil as described above, the degree of freedom of the interval between the RF shield 61 and the RF coil 11 or the interval between the main coil 59 and the shield coil 60 is more enhanced as compared with the first to fourth embodiments described above, and they can be set to proper values which do not lower both the efficiencies.

The invention claimed is:

1. A magnetic resonance imaging apparatus comprising a gradient magnetic field generator and a static magnetic field generator which are successively disposed in recited order to be nearer to an imaging space in which an examinee is disposed, the gradient magnetic field generator including a main coil for generating a gradient magnetic field in the imaging space, and a shield coil that is disposed between the main coil and the static magnetic field generator and generates a magnetic field for offsetting a leak magnetic field from the main coil to static magnetic field generator side, wherein a distance in a vertical direction between the main coil and the shield coil is increased with shift from a center portion of the main coil to end portions of the main coil.

2. The magnetic resonance imaging apparatus according to claim 1, wherein the distance in the vertical direction between the main coil and the horizontal axis is linearly reduced with the shift from the center portion of the main coil to the end portions of the main coil.

3. The magnetic resonance imaging apparatus according to claim 1, wherein the distance in the vertical direction between the main coil and the horizontal axis is reduced in the form of a curved line with the shift from the center portion of the main coil to the end portions of the main coil.

4. The magnetic resonance imaging apparatus according to claim 3, wherein the center portion of the main coil is varied gradually.

5. The magnetic resonance imaging apparatus according to claim 1, wherein the main coil has a symmetrical shape with respect to a plane vertical to the static magnetic field direction containing the center point of the imaging space.

6. The magnetic resonance imaging apparatus according to claim 1, wherein the main coil has a partial cone comprising a conductor plate that has a sectorial shape defined by two linear portions intersecting to each other at a predetermined angle and two arcuate portions different in radius and has a circuit pattern formed thereon, the two linear portions of the conductor plate being connected to each other.

7. The magnetic resonance imaging apparatus according to claim 6, wherein the partial cone is expanded or shrunk in the vertical direction to form a curved line portion at least a part thereof in the horizontal axis direction.

8. The magnetic resonance imaging apparatus according to claim 1, wherein an RF shield is disposed in conformity with the shape of the main coil at the imaging space side of the main coil.

9. The magnetic resonance imaging apparatus according to claim 1, wherein an RF coil is disposed at the center portion at the imaging space side of the main coil.

10. The magnetic resonance imaging apparatus according to claim 1, wherein the gradient magnetic field generator has a tubular shape, the main coil is disposed at the imaging space side, and the shield coil is disposed at the static magnetic field generator side.

11. The magnetic resonance imaging apparatus according to claim 10, wherein the main coil has a conical shape in which the internal diameter at the center point side of the imaging space is larger than the internal diameter at the end portion side in the static magnetic field direction.

12. The magnetic resonance imaging apparatus according to claim 1, wherein the gradient magnetic field generator has a pair of coil portions confronting each other through the imaging space, and in each of the paired coil portions, the main coil is disposed at the imaging space side and the shield coil is disposed at the static magnetic field generator side.

13. The magnetic resonance imaging apparatus according to claim 12, wherein each of the paired coil portions has a conical shape in which the interval therebetween at the center portion is larger than the interval therebetween at the end portions.

14. A gradient magnetic field coil that is used in a magnetic resonance imaging apparatus, has an imaging space therein and comprises a main coil for generating a gradient magnetic field in the imaging space and a shield coil for generating a magnetic field canceling a leak magnetic field from the main coil to an opposite side to the imaging space, wherein an interval between the main coil and the shield coil is increased with shift from a center portion of the main coil to end portions of the main coil.

15. The gradient magnetic field coil according to claim 14, wherein the interval between the main coil and the shield coil is linearly increased with the shift from the center portion of the main coil to the end portions of the main coil.

16. The gradient magnetic field coil according to claim 14, wherein the interval between the main coil and the shield coil is increased in the form of a curved line with the shift from the center portion of the main coil to the end portions of the main coil.

17. The gradient magnetic field coil according to claim 14, wherein the gradient magnetic field coil has a tubular shape, the main coil is disposed at the imaging space side, and the shield coil is disposed at the opposite side to the imaging space of the main coil.

18. The gradient magnetic field coil according to claim 14, wherein the gradient magnetic field coil has a pair of coil portions confronting each other through the imaging space therebetween, and in each of the paired coil portions, the main coil is disposed at the imaging space side and the shield coil is disposed at the opposite side to the imaging space of the main coil.

19. A magnetic resonance imaging apparatus comprising:
a gradient magnetic field generator and a static magnetic field generator which are successively disposed in recited order to be nearer to an imaging space in which an examinee is disposed, the gradient magnetic field generator including a main coil for generating a gradient magnetic field in the imaging space and a shield coil that is disposed between the main coil and the static magnetic field generator and generates a magnetic field for canceling a leak magnetic field from the main coil to static magnetic field generator side, wherein the main coil includes a center portion confronting a center point of the imaging space, and side portions disposed at end portion sides of the center portion so as to be separated from the center portion, at least parts of end portions of the center portion and at least parts of the end portions at center portion sides of the side portions are overlapped with each other in a vertical direction, and a distance in the vertical direction between the main coil and the shield coil is stepwise increased from the center portion to the side portions.

20. The magnetic resonance imaging apparatus according to claim 19, wherein circuit patterns are independently formed on the center portion and the side portions, and current flows in the opposite directions at the overlapped portions thereof.

21. The magnetic resonance imaging apparatus according to claim 19, wherein the gradient magnetic field generator has a tubular shape, the main coil is disposed at the imaging space side, the shield coil is disposed at the static magnetic field generator side, and the center portion and the side portions have a cylindrical shape which is uniform in internal diameter in the static magnetic field direction.

22. The magnetic resonance imaging apparatus according to claim 19, wherein the gradient magnetic field generator has a pair of coil portions confronting each other through the imaging space therebetween, in each of the paired coil portions, the main coil is disposed at the imaging space side while the shield coil is disposed at the static magnetic field generator side, and the center portion has a circular disc shape while the side portions have a hollow circular disc shape.

* * * * *